(12) United States Patent
Zhang

(10) Patent No.: US 9,559,082 B2
(45) Date of Patent: *Jan. 31, 2017

(54) THREE-DIMENSIONAL VERTICAL MEMORY COMPRISING DICE WITH DIFFERENT INTERCONNECT LEVELS

(71) Applicant: HangZhou HaiCun Information Technology Co., Ltd., HangZhou (CN)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/185,004

(22) Filed: Jun. 16, 2016

(65) Prior Publication Data

US 2016/0293584 A1    Oct. 6, 2016

Related U.S. Application Data

(63) Continuation-in-part of application No. 14/884,755, filed on Oct. 15, 2015, now Pat. No. 9,396,764, which (Continued)

(51) Int. Cl.
*H01L 25/065* (2006.01)
*G11C 13/00* (2006.01)
(Continued)

(52) U.S. Cl.
CPC ............. *H01L 25/0657* (2013.01); *G11C 5/02* (2013.01); *G11C 5/04* (2013.01); *G11C 5/145* (2013.01); *G11C 8/14* (2013.01); *G11C 13/004* (2013.01); *G11C 13/0004* (2013.01); *G11C 13/0011* (2013.01); *G11C 13/0021* (2013.01); *G11C 13/0023* (2013.01); *G11C 13/0069* (2013.01); *G11C 16/0483* (2013.01); *G11C 16/08* (2013.01); *G11C 16/10* (2013.01); *G11C 16/26* (2013.01); *H01L 25/18* (2013.01); *G11C 13/0002* (2013.01); *G11C 2029/0411* (2013.01); *G11C 2213/71* (2013.01); *H01L 24/13* (2013.01); *H01L 24/16* (2013.01); *H01L 24/48* (2013.01); *H01L 24/73* (2013.01);
(Continued)

(58) Field of Classification Search
CPC combination set(s) only.
See application file for complete search history.

(56) References Cited

U.S. PATENT DOCUMENTS 4,404,655 A    9/1983    Naiff
4,424,579 A    1/1984    Roesner
(Continued)

*Primary Examiner* — Kyoung Lee
*Assistant Examiner* — Ratisha Mehta

(57) ABSTRACT

The present invention discloses a three-dimensional vertical memory (3D-$M_V$). It comprises at least a 3D-array die and at least a peripheral-circuit die. The 3D-array die comprises a plurality of vertical memory strings. The number of interconnect levels in the peripheral-circuit die is more than the number of interconnect levels in the 3D-array die, but substantially less than the number of memory cells on each of the vertical memory strings in the 3D-array die.

18 Claims, 12 Drawing Sheets

Related U.S. Application Data is a continuation-in-part of application No. 14/803,104, filed on Jul. 19, 2015, now abandoned, which is a continuation-in-part of application No. 14/636,359, filed on Mar. 3, 2015, now Pat. No. 9,123,393, which is a continuation-in-part of application No. 14/047,011, filed on Oct. 6, 2013, now Pat. No. 9,093,129, which is a continuation-in-part of application No. 13/787,787, filed on Mar. 6, 2013, now Pat. No. 8,890,300, which is a continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
| | |
|---|---|
| *H01L 25/18* | (2006.01) |
| *G11C 16/26* | (2006.01) |
| *G11C 16/10* | (2006.01) |
| *G11C 16/08* | (2006.01) |
| *G11C 16/04* | (2006.01) |
| *G11C 5/02* | (2006.01) |
| *G11C 5/04* | (2006.01) |
| *G11C 5/14* | (2006.01) |
| *G11C 8/14* | (2006.01) |
| *H01L 23/00* | (2006.01) |
| *H01L 25/10* | (2006.01) |
| *G11C 29/04* | (2006.01) |

(52) U.S. Cl.
CPC ........ *H01L 25/0655* (2013.01); *H01L 25/105* (2013.01); *H01L 2224/13101* (2013.01); *H01L 2224/16145* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2225/1023* (2013.01); *H01L 2225/1064* (2013.01); *H01L 2924/00014* (2013.01); *H01L 2924/181* (2013.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 6,903,427 B2 | 6/2005 | Zhang |
| 7,386,652 B2 | 6/2008 | Zhang |
| 7,423,304 B2 | 9/2008 | Cleeves et al. |
| 7,449,376 B2 | 11/2008 | Isobe et al. |
| 7,728,391 B2 | 6/2010 | Zhang |
| 8,325,527 B2 | 12/2012 | Jin et al. |
| 8,345,479 B2 | 1/2013 | Maejima |
| 8,519,472 B2 | 8/2013 | Jeong et al. |
| 8,638,611 B2 | 1/2014 | Sim et al. |
| 2003/0067043 A1* | 4/2003 | Zhang ............... G11C 7/18 257/390 |
| 2007/0252153 A1 | 11/2007 | Koyama |
| 2011/0216603 A1* | 9/2011 | Han ............... G11C 16/04 365/185.23 |
| 2012/0025164 A1* | 2/2012 | Deweerd ............ G11C 13/0004 257/5 |
| 2012/0033501 A1* | 2/2012 | Park ............... G11C 11/5642 365/185.19 |
| 2012/0155168 A1 | 6/2012 | Kim et al. |
| 2012/0218817 A1 | 8/2012 | Kang et al. |
| 2013/0003480 A1* | 1/2013 | D'Abreu ............ G06F 13/1668 365/218 |
| 2013/0126957 A1 | 5/2013 | Higashitani et al. |
| 2013/0151760 A1 | 6/2013 | Cho et al. |
| 2014/0063938 A1 | 3/2014 | Oh et al. |

\* cited by examiner

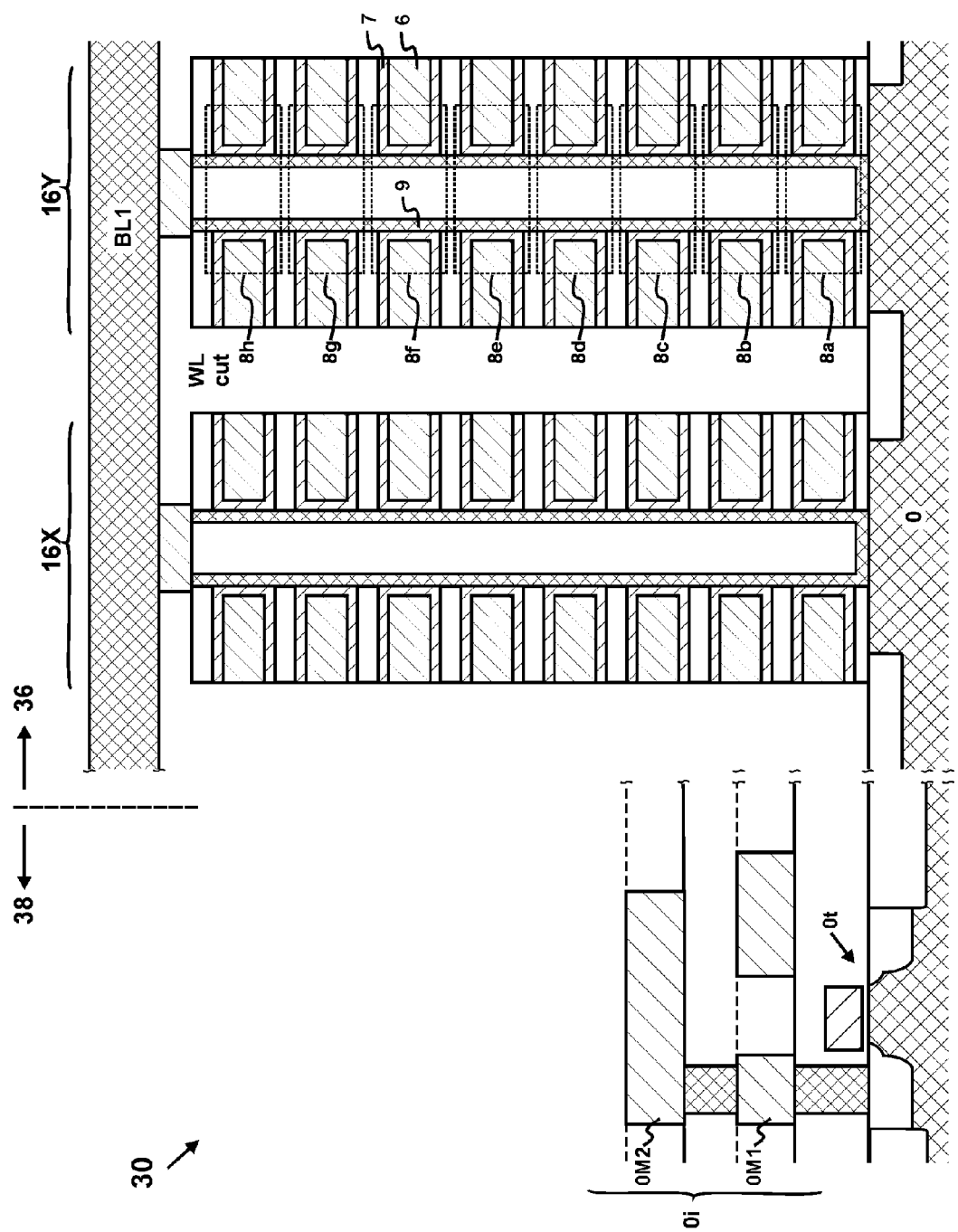

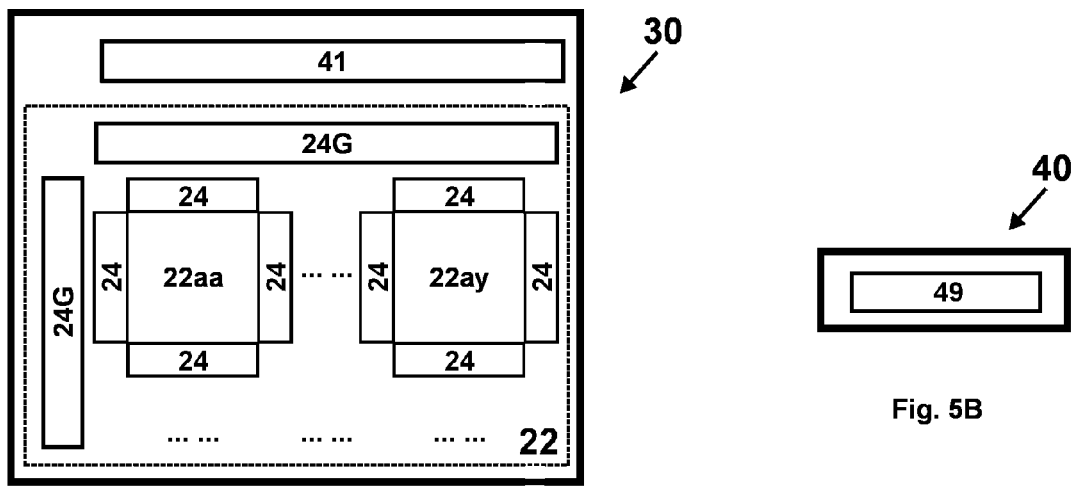
Fig. 5A
Fig. 5B
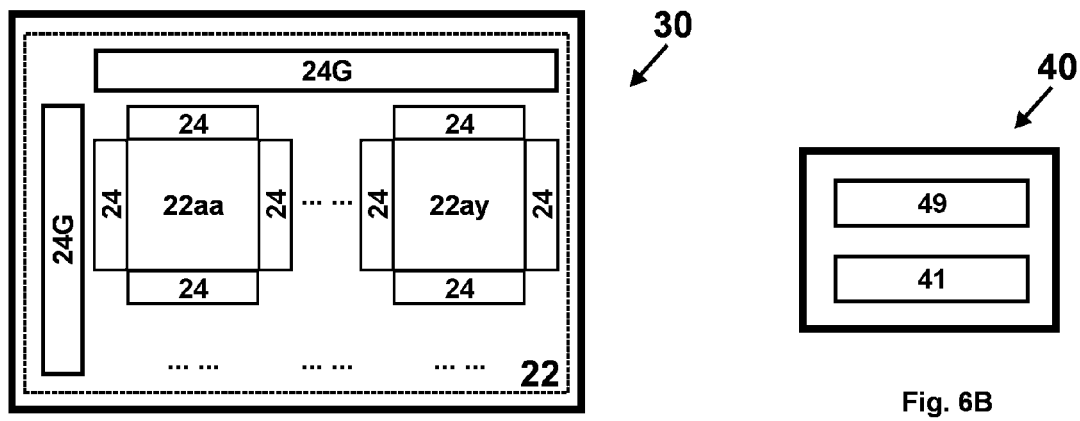
Fig. 6A
Fig. 6B

THREE-DIMENSIONAL VERTICAL MEMORY COMPRISING DICE WITH DIFFERENT INTERCONNECT LEVELS

CROSS-REFERENCE TO RELATED APPLICATIONS

This is a continuation-in-part of application "Discrete Three-Dimensional Memory", application Ser. No. 14/884,755, filed Oct. 15, 2015, which is a continuation-in-part of application "Discrete Three-Dimensional Vertical Memory", application Ser. No. 14/803,104, filed Jul. 19, 2015, which is a continuation-in-part of application "Discrete Three-Dimensional Vertical Memory", application Ser. No. 14/636,359, filed Mar. 3, 2015, which is a continuation-in-part of application "Discrete Three-Dimensional Memory Comprising Dice with Different BEOL Structures", application Ser. No. 14/047,011, filed Oct. 6, 2013, which is a continuation-in-part of application "Discrete Three-Dimensional Memory Comprising Off-Die Read/Write-Voltage Generator", application Ser. No. 13/787,787, filed Mar. 6, 2013, which is a continuation-in-part of application "Discrete Three-Dimensional Memory", application Ser. No. 13/591,257, filed Aug. 22, 2012, which claims benefit of a provisional application "Three-Dimensional Memory with Separate Memory-Array and Peripheral-Circuit Substrates", Application Ser. No. 61/529,929, filed Sep. 1, 2011.

BACKGROUND

1. Technical Field of the Invention

The present invention relates to the field of integrated circuit, and more particularly to three-dimensional vertical memory (3D-$M_V$).

2. Prior Arts

Three-dimensional memory (3D-M) is a monolithic semiconductor memory comprising a plurality of vertically stacked memory cells. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further be a 3D-memristor, 3D-RRAM or 3D-ReRAM (resistive random-access memory), 3D-PCM (phase-change memory), 3D-PMC (programmable metallization-cell memory), or 3D-CBRAM (conductive-bridging random-access memory).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate circuit 0K and a plurality of vertically stacked memory levels 16A, 16B. In this example, the interconnects 0$i$ include metal levels 0M1, 0M2. Hereinafter, the metal levels 0M1, 0M2 in the interconnects 0$i$ are referred to as interconnect levels; the materials used in the interconnects 0$i$ are referred to as interconnect materials.

The memory levels 16A, 16B are stacked above the substrate circuit 0K. They are coupled to the substrate 0 through contact vias (e.g. 1$av$). Each of the memory levels (e.g. 16A) comprises a plurality of upper address lines (e.g. 2$a$), lower address lines (e.g. 1$a$) and memory cells (e.g. 5$aa$). The memory cells could comprise diodes, transistors or other devices. Among all types of memory cells, the diode-based memory cells are of particular interest because they have the smallest size of ~$4F^2$, where F is the minimum feature size. Since they are generally located at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In other disclosures, diode is also referred to as steering device or selection device. In one exemplary embodiment, diode is a semiconductor diode, e.g. p-i-n silicon diode. In another exemplary embodiment, diode is a metal-oxide diode, e.g. titanium-oxide diode, nickel-oxide diode.

The memory levels 16A, 16B collectively form at least a 3D-M array 16, while the substrate circuit 0K comprises the peripheral circuit for the 3D-M array 16. A first portion of the peripheral circuit is located underneath the 3D-M array 16 and it is referred to as under-array peripheral circuit. A second portion of the peripheral circuit is located outside the 3D-M array 16 and it is referred to as outside-array peripheral circuits 18. Because the outside-array peripheral circuit 18 generally comprises fewer back-end-of-line (BEOL) levels than the 3D-M array 16, the space 17 above the outside-array peripheral circuits 18 is empty and completely wasted. Hereinafter, a BEOL level refers to a level of conductive lines above the substrate, e.g. an address-line level in the memory levels 16A, 16B; or, an interconnect level in the interconnects 0$i$. In FIG. 1A, the 3D-M array 16 comprises a total of six BEOL levels, including the two interconnect levels 0M1, 0M2, two address-line levels 1$a$, 2$a$ for the first memory level 16A, and two address-line levels 3$a$, 4$a$ for the second memory level 16B. The outside-array peripheral circuit 18 comprises only two BEOL levels, i.e. the interconnect levels 0M1, 0M2.

U.S. Pat. No. 7,383,476 issued to Crowley et al. on Jun. 3, 2008 discloses an integrated 3D-M die, whose 3D-M arrays and peripheral circuit are integrated into a single die. Generally, this design methodology is known as full integration. As is illustrated in FIG. 1B, an integrated 3D-M die 20 comprises a 3D-array region 22 and a peripheral-circuit region 28. The 3D-array region 22 comprises a plurality of 3D-M arrays (e.g. 22$aa$, 22$ay$) and their decoders (e.g. 24, 24G). These decoders include local decoders 24 and global decoders 24G. The local decoder 24 decodes address/data for a single 3D-M array, while the global decoder 24G decodes global address/data 25 to each 3D-M array.

The peripheral-circuit region 28 comprises all necessary peripheral-circuit components for a standalone integrated 3D-M die 20 to perform basic memory functions, i.e. it can directly use the voltage supply 23 provided by a user (e.g. a host device or a controller), directly read and/or write data 27 for the user. It includes a read/write-voltage generator ($V_R/V_W$-generator) 21 and an address/data (A/D)-translator 29. The $V_R/V_W$-generator 21 provides read voltage $V_R$ and/or write (programming) voltage $V_W$ to the 3D-M array(s). The A/D-translator 29 converts address and/or data from a logical space to a physical space and/or vice versa. Hereinafter, the logical space is the space viewed from the perspective of a user of the 3D-M, while the physical space is the space viewed from the perspective of the 3D-M.

The example in FIGS. 1A-1B is a three-dimensional horizontal memory (3D-$M_H$), whose basic storage units are horizontal memory levels. The above description can also be applied to a three-dimensional vertical memory (3D-$M_V$), whose basic storage units are vertical memory strings.

U.S. Pat. No. 8,638,611 issued to Sim et al. on Jan. 28, 2014 discloses a 3D-$M_V$. It is a vertical-NAND. Besides vertical-NAND, the 3D-ROM, 3D-RAM, 3D-memristor, 3D-ReRAM or 3D-RRAM, 3D-PCM, 3D-PMC, 3D-CBRAM can also be arranged into 3D-$M_V$. As illustrated in FIG. 2, a 3D-$M_V$ die 20 comprises at least a 3D-$M_V$ array 16 and a peripheral circuit 18. The 3D-$M_V$ array 16 comprises a plurality of vertical memory strings 16X, 16Y. Each memory string (e.g. 16X) comprises a plurality of vertically stacked memory cells (e.g. 8a-8h). These memory cells are coupled by at least a vertical address line. Each memory cell (e.g. 8f) comprises at least a vertical transistor, with a gate 6, an information storage layer 7 and a vertical channel 9. The gate 6 of each memory cell (e.g. 8f) on a vertical memory string forms a BEOL level. In this example, the 3D-$M_V$ array 16 comprises eight BEOL levels, i.e. the memory cells 8a-8h.

The peripheral circuit 18 for the 3D-$M_V$ array 16 comprises transistors 0t and interconnects 0i. The transistors 0t are conventional (horizontal) transistors formed in the semiconductor substrate 0. The interconnects 0i do not include any memory cells. Similar to 3D-$M_H$, the peripheral circuit of 3D-$M_V$ could comprise under-array peripheral-circuit components, as well as outside-array peripheral-circuit components. In this example, all peripheral-circuit components are outside the 3D-$M_V$ array 16 and the peripheral circuit 18 comprises two BEOL levels, i.e. the interconnect levels 0M1, 0M2. It should be noted that this 3D-$M_V$ is an integrated 3D-$M_V$, where the 3D-$M_V$ array 16 and the peripheral circuit 18 are integrated into a single 3D-$M_V$ die 20.

It is a prevailing belief in the field of integrated circuit that more integration is better, because integration lowers cost, improves performance and reduces size. However, this belief is no longer true for 3D-$M_V$. As the 3D-$M_V$ 20 is optimized for the 3D-$M_V$ array 16, the cost, performance and size of the peripheral circuit 18 are sacrificed. First of all, because the vertical memory strings 16X, 16Y comprises significantly more BEOL levels than the peripheral circuit 18, full integration would force a relatively simple peripheral circuit 18 to use the expensive BEOL manufacturing process of the 3D-$M_V$ array 16. This increases the overall 3D-$M_V$ cost. Secondly, because it comprises only a small number of interconnect levels (two in FIG. 2), the peripheral circuit 18 is difficult to design, have a poor performance and occupy a large area. Thirdly, full integration would force the peripheral circuit 18 to use the same high-temperature interconnect materials (e.g. tungsten and/or silicon oxide) as the 3D-$M_V$ array 16. These materials slow down the peripheral circuit 18 and in turn, degrade the overall 3D-$M_V$ performance.

Objects and Advantages

It is a principle object of the present invention to provide a three-dimensional vertical memory (3D-$M_V$) with a lower overall cost.

It is a further object of the present invention to provide a 3D-$M_V$ with an improved overall performance.

It is a further object of the present invention to provide a 3D-$M_V$ with a smaller overall size.

In accordance with these and other objects of the present invention, a discrete 3D-$M_V$ is disclosed.

SUMMARY OF THE INVENTION

To lower its overall cost, improve its overall performance and reduce its overall size, the present invention follows this design guideline for the 3D-$M_V$: separate the 3-D circuit and 2-D circuit into different dice in such a way that they could be optimized separately. For example, the 3D-$M_V$ array (3-D circuit) and at least a peripheral-circuit component thereof (2-D circuit) are separated into different dice. Accordingly, the present invention discloses a discrete 3D-$M_V$. It comprises at least a 3D-array die and at least a peripheral-circuit die. The 3D-array die is formed in a 3-D space and comprises a plurality of functional levels. It comprises at least a 3D-$M_V$ array and at least a first peripheral-circuit component thereof, which is referred to as the in-die peripheral-circuit component. The peripheral-circuit die is formed on a 2-D plane and comprises just a single functional level. It comprises at least a second peripheral-circuit component of the 3D-$M_V$ array, which is referred to as the off-die peripheral-circuit component. This off-die peripheral-circuit component is an essential circuit for the 3D-$M_V$ to perform basic memory functions, e.g. directly using the voltage supply provided by a user, directly reading data from the user and/or directly writing data to the user. It could be a read/write-voltage generator ($V_R/V_W$-generator), an address/data translator (A/D-translator), a portion of the $V_R/V_W$-generator, and/or a portion of the A/D-translator. Without this off-die peripheral-circuit component, the 3D-array die per se is not a functional memory.

Designed and manufactured separately, the 3D-array die and the peripheral-circuit die in a discrete 3D-$M_V$ comprise substantially different back-end-of-line (BEOL) structures. Since the 3D-array die and the integrated 3D-$M_V$ die have similar structures, the peripheral-circuit die (of the discrete 3D-$M_V$) and the integrated 3D-$M_V$ die have substantially different BEOL structures, too. The BEOL structures of the peripheral-circuit die could be independently optimized in such a way that the off-die peripheral-circuit components have lower cost, better performance and/or smaller size than their counterparts in the integrated 3D-$M_V$. Hence, the discrete 3D-$M_V$ has a lower overall cost, a better overall performance and/or a smaller overall size of than the integrated 3D-$M_V$ of the same storage capacity.

In terms of different BEOL structures, the peripheral-circuit die could differ from the 3D-array die in at least three scenarios. In a first scenario, the peripheral-circuit die comprises substantially fewer BEOL levels than the 3D-array die (or, the integrated 3D-$M_V$ die). Because the wafer cost is roughly proportional to the number of BEOL levels, the peripheral-circuit die would have a much lower wafer cost than the 3D-array die and the integrated 3D-$M_V$ die. Hence, the total die cost of the discrete 3D-$M_V$ (including at least two dice: a 3D-array die and a peripheral-circuit die) is lower than that of the integrated 3D-$M_V$ (which is a single die comprising both the 3D-$M_V$ arrays and the peripheral circuit). In one preferred embodiment, the number of memory cells on a memory string in the 3D-array die is preferably at least twice as much as the number of interconnect levels in the peripheral-circuit die. This large difference ensures that the reduction in the total die cost (from the integrated 3D-$M_V$ to the discrete 3D-$M_V$) could offset the extra bonding cost (for two separate dice in the discrete 3D-$M_V$). As a result, the discrete 3D-$M_V$ has a lower overall cost than the integrated 3D-$M_V$ for a given storage capacity.

In a second scenario, the peripheral-circuit die comprises more interconnect levels than the 3D-array die (or, the integrated 3D-$M_V$ die). Accordingly, the off-die peripheral-circuit components of the discrete 3D-$M_V$ are easier to design, have better performance and occupy less die area than their counterparts in the integrated 3D-$M_V$. Hence, the discrete 3D-$M_V$ has a better overall performance and a smaller overall size then the integrated 3D-$M_V$. Similar to the integrated 3D-$M_V$, the interconnects of the 3D-array die do not include any memory structures. The number of interconnect levels in the 3D-array die is the larger of its under-array peripheral-circuit components and its outside-array peripheral-circuit components. It should be reminded that, although a large number is desired, the number of the interconnect levels in the peripheral-circuit die is still bounded by the overall cost of the discrete 3D-$M_V$. To ensure that the discrete 3D-$M_V$ has a lower overall cost than the integrated 3D-$M_V$, the peripheral-circuit die should comprise substantially fewer BEOL levels than the 3D-array die (referring to the first scenario). For example, the number of interconnect levels in the peripheral-circuit die is substantially less than the number of memory cells on a memory string in the 3D-array die.

In a third scenario, the peripheral-circuit die comprises different interconnect materials than the 3D-array die (or, the integrated 3D-$M_V$ die). To be more specific, the peripheral-circuit die comprise high-speed interconnect materials (e.g. copper and/or high-k dielectric), whereas the 3D-array die and the integrated 3D-$M_V$ die comprise high-temperature interconnect materials (e.g. tungsten and/or silicon oxide). Because the high-speed interconnect materials are generally faster than the high-temperature interconnect materials, the off-die peripheral-circuit components of the discrete 3D-$M_V$ have a faster speed than their counterparts in the integrated 3D-$M_V$. Hence, the discrete 3D-$M_V$ has a better overall performance than the integrated 3D-$M_V$.

Accordingly, the present invention discloses a discrete 3D-$M_V$, comprising: a 3D-array die comprising at least a 3D-$M_V$ array, wherein said 3D-$M_V$ array comprises a plurality of vertical memory strings, each of said vertical memory strings comprising a plurality of vertically stacked memory cells; a peripheral-circuit die comprising at least an off-die peripheral-circuit component of said 3D-$M_V$ array, wherein said off-die peripheral-circuit component is absent from said 3D-array die; means for coupling said 3D-array die and said peripheral-circuit die; wherein the number of memory cells on each of said vertical memory strings in said 3D-array die is at least twice as much as the number of interconnect levels in said peripheral-circuit die; and, said 3D-array die and said peripheral-circuit die are separate dice.

The present invention further discloses another discrete 3D-$M_V$, comprising: a 3D-array die comprising at least a 3D-$M_V$ array, wherein said 3D-$M_V$ array comprises a plurality of vertical memory strings, each of said vertical memory strings comprising a plurality of vertically stacked memory cells; a peripheral-circuit die comprising at least an off-die peripheral-circuit component of said 3D-$M_V$ array, wherein said off-die peripheral-circuit component is absent from said 3D-array die; means for coupling said 3D-array die and said peripheral-circuit die; wherein the number of interconnect levels in said peripheral-circuit die is more than the number of interconnect levels in said 3D-array die, but substantially less than the number of memory cells on each of said vertical memory strings in said 3D-array die; and, said 3D-array die and said peripheral-circuit die are separate dice.

The present invention further discloses yet another discrete 3D-$M_V$, comprising: a 3D-array die comprising at least a 3D-$M_V$ array and an in-die peripheral-circuit component of said 3D-$M_V$ array, wherein said 3D-$M_V$ array comprises a plurality of vertical memory strings, each of said vertical memory strings comprising a plurality of vertically stacked memory cells; a peripheral-circuit die comprising at least an off-die peripheral-circuit component of said 3D-$M_V$ array, wherein said off-die peripheral-circuit component is absent from said 3D-array die; means for coupling said 3D-array die and said peripheral-circuit die; wherein said off-die peripheral-circuit component and said in-die peripheral-circuit component comprise different interconnect materials; and, said 3D-array die and said peripheral-circuit die are separate dice.

BRIEF DESCRIPTION OF THE DRAWINGS

FIG. 4A is a cross-sectional view of a preferred 3D-array die.

FIGS. 5A-5B disclose a first preferred partitioning scheme;

FIGS. 6A-6B disclose a second preferred partitioning scheme;

Figure 1A:
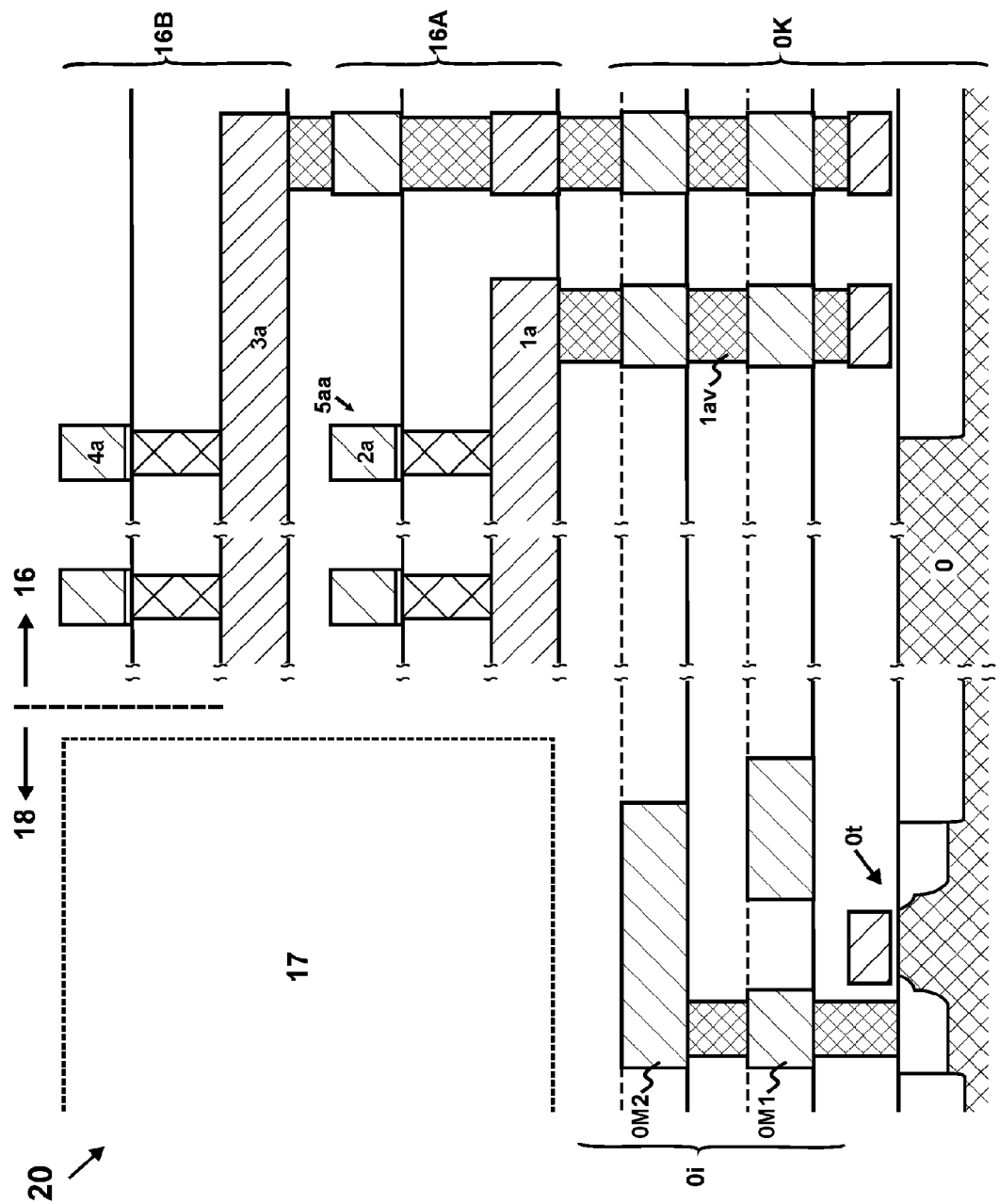
FIG. 1A is a cross-sectional views of an integrated three-dimensional horizontal memory (3D-$M_H$) (prior art)
Figure 1B:
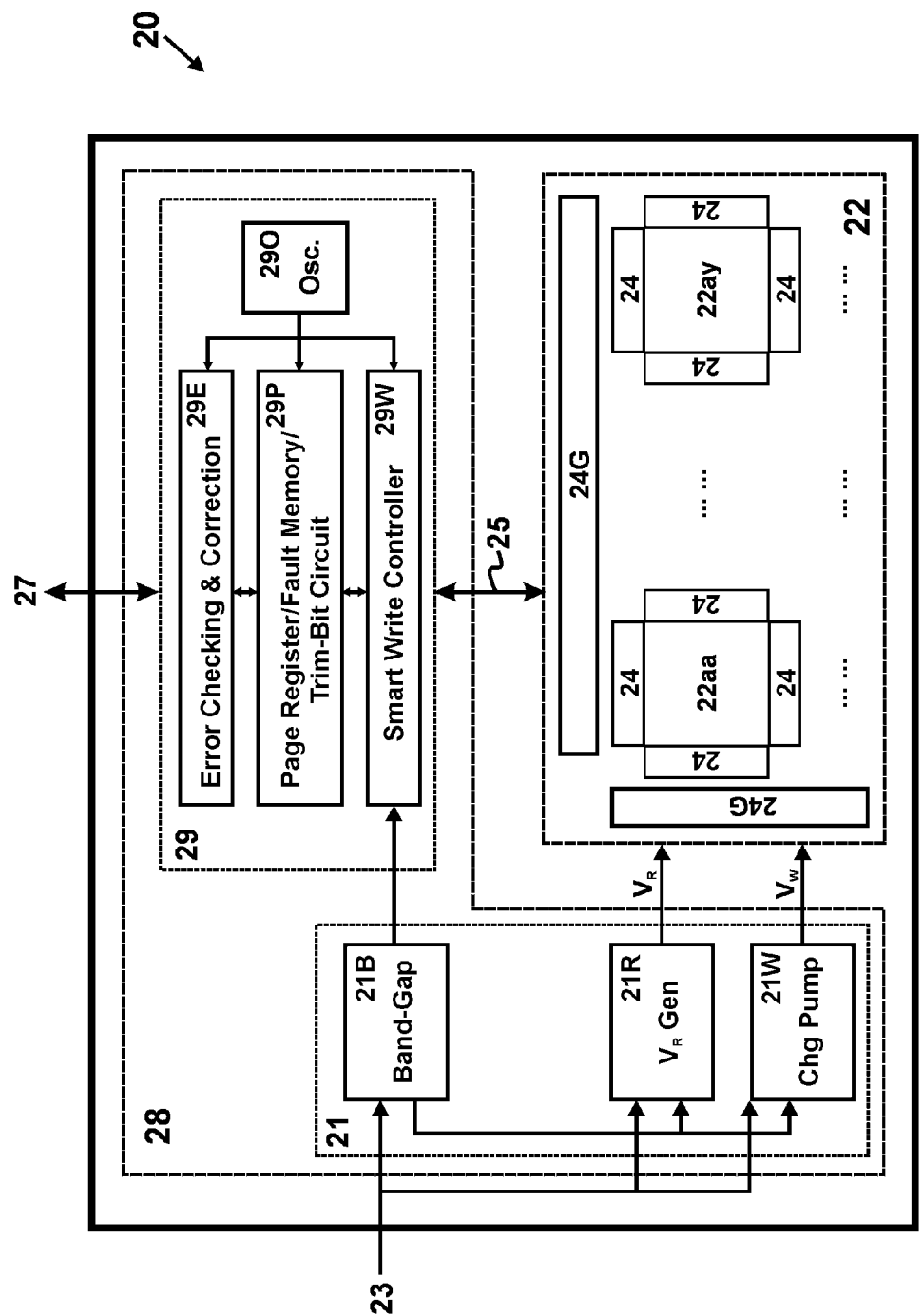
FIG. 1B is a block diagram of an integrated 3D-$M_H$ die (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write-voltage generator ($V_R/V_W$-generator) could generate either only the read voltage, or only the write voltage, or both the read voltage and the write voltage. In another example, the address/data (A/D)-translator could translate either only address, or only data, or both address and data.

Referring now to FIGS. 3A-3D, four preferred discrete three-dimensional vertical memory (3D-$M_V$) 50 are disclosed. The discrete 3D-$M_V$ 50 includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52*a* is referred to as voltage supply $V_{DD}$. The ground contact 52*b* provides a ground connection at a voltage $V_{SS}$. The contacts 54*a*-54*d* provide signal connections between the host and the discrete 3D-$M_V$ 50. The signals represented on the contacts 54*a*-54*d* include address and data, among others. Because they are directly to/from the host, the address and data represented on the contacts 54*a*-54*d* are logical address and logical data.

The discrete 3D-$M_V$ 50 comprises at least a 3D-array die 30 and at least a peripheral-circuit die 40/40\*. In these figures, at least an off-die peripheral-circuit component of the 3D-$M_V$ is located on the peripheral-circuit die 40/40\* instead of the 3D-array die 30. This off-die peripheral circuit is an essential circuit for the 3D-$M_V$ to perform basic memory functions, e.g. directly using the voltage supply provided by a user, directly reading data from the user and/or directly writing data to the user. It could be a read/write-voltage generator ($V_R/V_W$-generator), an address/data translator (A/D-translator), a portion of the $V_R/V_W$-generator, and/or a portion of the A/D-translator. Without this off-die peripheral circuit, the 3D-array die 30 per se is not a functional memory.

Figure 3A:
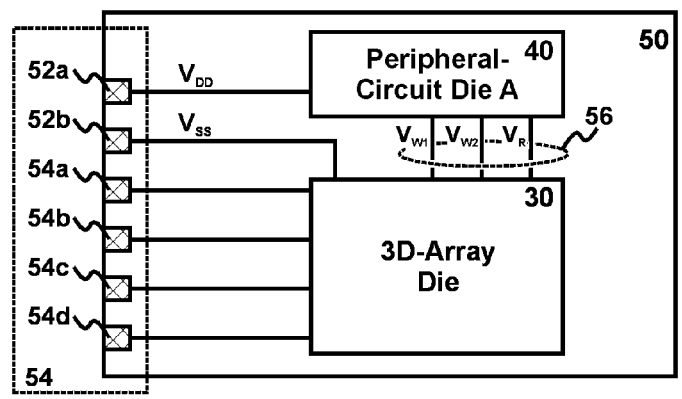
FIGS. 3A-3D illustrate four preferred discrete 3D-$M_V$'s.

The preferred discrete 3D-$M_V$ 50 in FIG. 3A is in the form of a memory card. Its peripheral-circuit die 40 comprises an off-die $V_R/V_W$-generator, which receives a voltage supply $V_{DD}$ from the power-supply contact 52*a* and provides the 3D-array die 30 with at least a read/write voltage through a power bus 56. The read/write voltage includes at least a read voltage and/or a write voltage other than the voltage supply $V_{DD}$. In other words, it could be either at least a read voltage $V_R$, or at least a write voltage $V_W$, or both read voltage $V_R$ and write voltage $V_W$, and the values of these read voltages and write voltages are different from the voltage supply $V_{DD}$. In this preferred embodiment, the read/write voltage includes one read voltage $V_R$ and two write voltages $V_{W1}$, $V_{W2}$. Alternatively, it could include more than one read voltage or more than two write voltages.

Figure 3B:
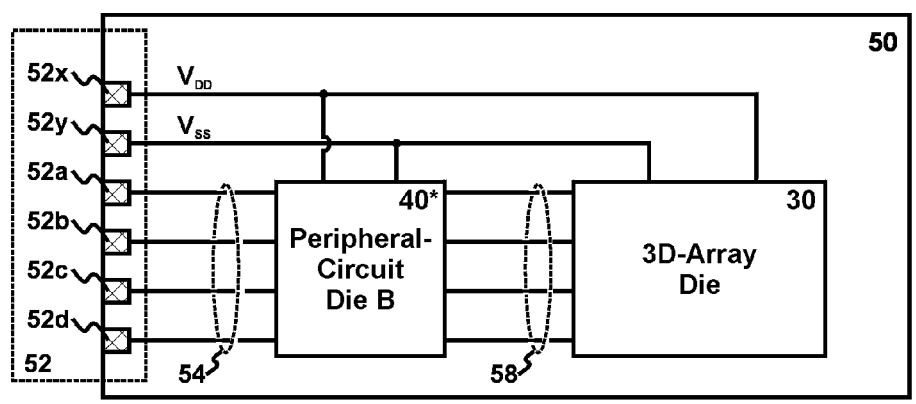

The preferred discrete 3D-$M_V$ 50 in FIG. 3B is also in the form of a memory card. Its peripheral-circuit die 40\* comprises an off-die A/D-translator, which includes an address converter and/or a data converter. The address converter converts the logical address represented on the contacts 54*a*-54*d* to the physical address represented on an internal bus 58 and/or vice versa; the data converter converts the logical data represented on the contacts 54*a*-54*d* to the physical data represented on an internal bus 58 and/or vice versa. The A/D-translator could convert address only, data only, or both address and data.

Figure 3C:
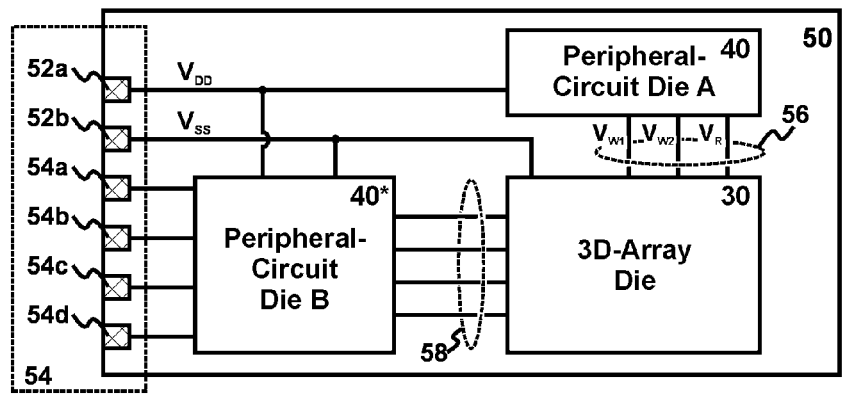

The preferred discrete 3D-$M_V$ 50 in FIG. 3C is also in the form of a memory card. It comprises two peripheral-circuit dice: a peripheral-circuit die A 40 and a peripheral-circuit die B 40\*. The peripheral-circuit die A 40 comprises an off-die $V_R/V_W$-generator and the peripheral-circuit die B 40\* comprises an off-die A/D-translator.

Figure 3D:
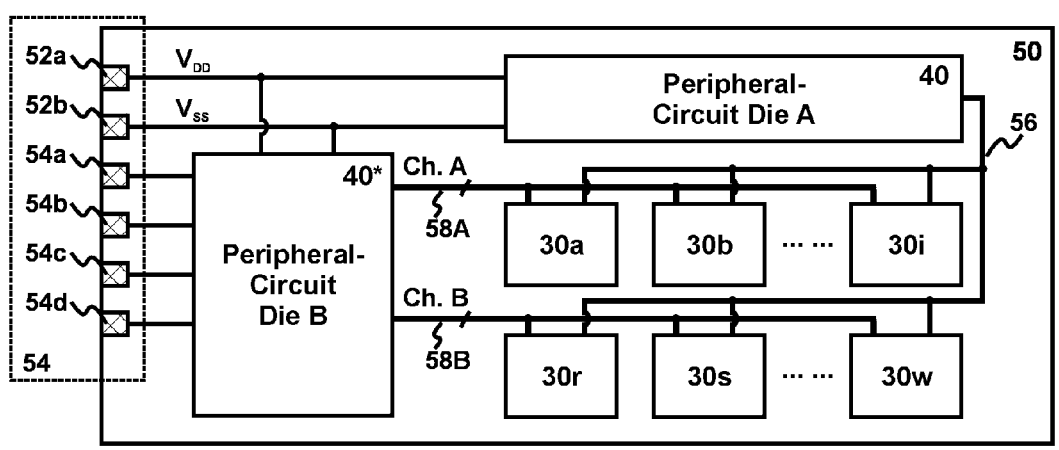

The preferred discrete 3D-M 50 in FIG. 3D can be used for a high-capacity memory card or a solid-state drive. It comprises two peripheral-circuit dice 40, 40\* and a plurality of 3D-array dice 30*a*, 30*b* ... 30*w*. The peripheral-circuit die A 40 comprises an off-die $V_R/V_W$-generator and the peripheral-circuit die B 40\* comprises an off-die A/D-translator. The 3D-array dice form two channels: Channel A and Channel B. The internal bus 58A on Channel A provides physical address/data to the 3D-array dice 30*a*, 30*b* ... 30*i*, while the internal bus 58B on Channel B provides physical address/data to the 3D-array dice 30*r*, 30*s* ... 30*w*. The power bus 56 provides the read/write-voltages to all 3D-array dice 30*a*, 30*b* ... 30*w*. Although two channels are used in this example, it should be apparent to those skilled in the art that more than two channels may be used.

Referring now to FIG. 4A, a cross-sectional view of a preferred 3D-array die 30 is disclosed. It comprises at least a 3D-$M_V$ array 36 and an in-die peripheral-circuit component 38. The 3D-$M_V$ array 36 is formed in a 3-D space and comprises a plurality of vertical memory strings (e.g. 16X, 16Y). Each memory string (e.g. 16Y) comprises a plurality of vertically stacked memory cells (e.g. 8*a*-8*h*). Each memory cell (e.g. 8*f*) comprises at least a vertical transistor, with gate 6, information storage layer 7 and channel 9. An exemplary memory cell is a vertical-NAND cell. The memory cell (e.g. 8*f*) is formed at the intersection of a horizontal address line (e.g. 6) and a vertical address line (e.g. 9). Hereinafter, the address lines at the same horizontal level as a specific horizontal address line form an address-line level. Because each horizontal address line is the gate of a memory cell, the number of address-line levels is equal to the number of memory cells on a vertical memory string. In this example, the number of memory cells on a vertical memory string (or, the number of address-line levels) is eight, i.e. 8*a*-8*h*. A real-world 3D-$M_V$ array could comprise 24 or more memory cells on a vertical memory string (or, address-line levels).

The in-die peripheral circuit 38 comprises transistors 0*t* and interconnects 0*i*. As the interconnects of the 3D-array die 30 include the BEOL structures above the substrate 0 except all memory structures, the interconnects 0*i* in the in-die peripheral circuit 38 of FIG. 4A are also the interconnects of the 3D-array die 30. On the other hand, because the in-die peripheral circuit 38 could comprise under-array peripheral-circuit components and outside-array peripheral-circuit components, the number of interconnect levels in the 3D-array die 30 is the larger of the under-array peripheral-circuit components and the outside-array peripheral-circuit components. In this example, the number of interconnect levels in the 3D-array die 30 is two, i.e. 0M1, 0M2.

Because the processing steps of the 3D-$M_V$ array 36 and the in-die peripheral-circuit component 38 are generally incompatible, the total number of BEOL levels in the 3D-array die 30 would be equal to the sum of the number of its address-line levels (or, the number of memory cells on a vertical memory string) and the number of its interconnect levels. In this case, the total number of BEOL levels in the 3D-array die 30 is ten, including eight address-line levels 8*a*-8*h* and two interconnect levels 0M1-0M2.

Figure 2:
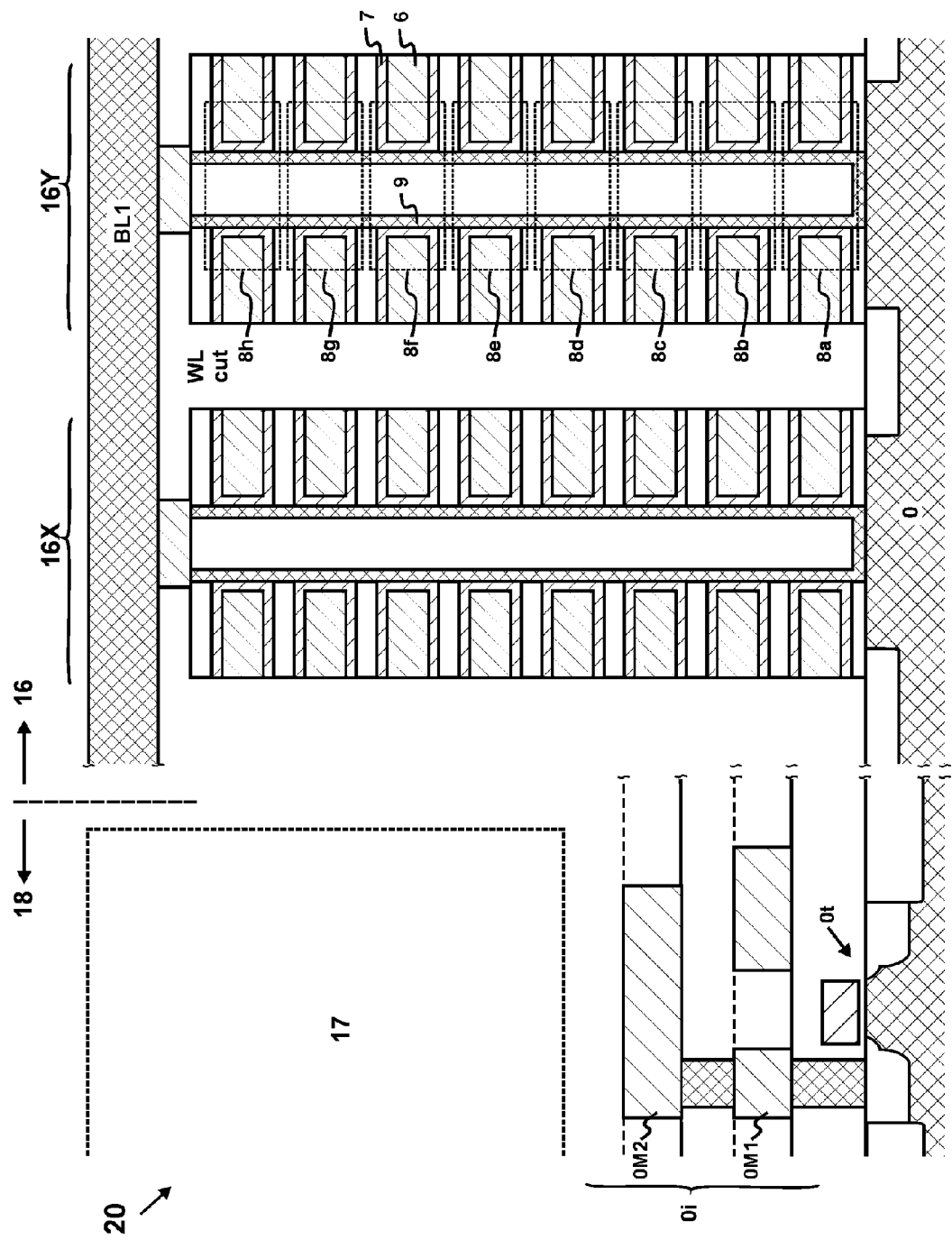
FIG. 2 is a cross-sectional view of an integrated three-dimensional vertical memory (3D-$M_V$) (prior art)

Although the cross-sectional view of FIG. 4A is similar to that of FIG. 2, the peripheral circuit 18 of FIG. 2 comprises all peripheral-circuit components of the integrated 3D-$M_V$ 20, whereas at least one peripheral-circuit component of the discrete 3D-$M_V$ 30 is absent from the in-die peripheral circuit 38 of FIG. 4A. For example, at least a $V_R/V_W$-generator and/or an A/D-translator is absent from the in-die peripheral circuit 38. Further details on the in-die peripheral circuit 38 are disclosed in FIGS. 5A-8B.

Figure 4B:
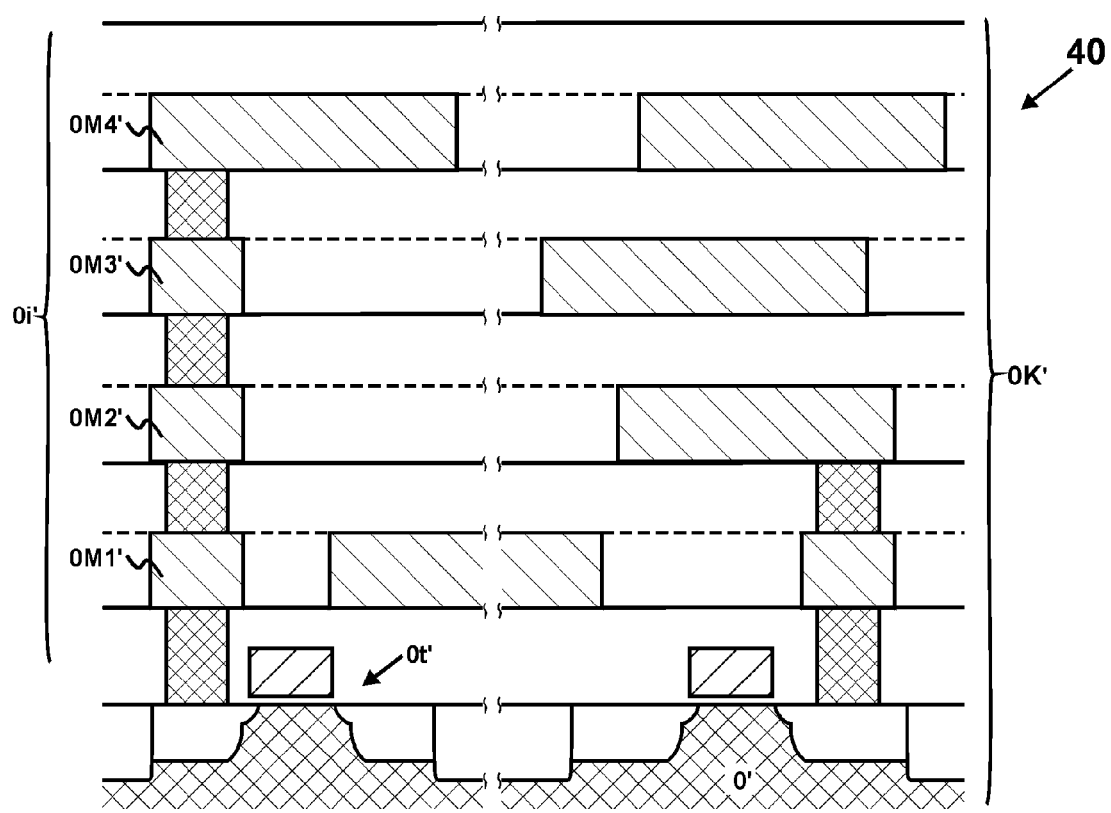
FIG. 4B is a cross-sectional view of a preferred peripheral-circuit die.

Referring now to FIG. 4B, a cross-sectional view of a preferred peripheral-circuit die 40 is disclosed. The peripheral-circuit die 40 is formed on a 2-D plane and includes a single functional level, i.e. the substrate circuit 0K'. The substrate circuit 0K' comprises transistors 0*t*' and interconnects 0*i*'. As the peripheral-circuit die 40 does not comprise any memory structures, its BEOL levels are same as its interconnect levels. In this example, the number of BEOL levels (or, interconnect levels) in the peripheral-circuit die 40 is four, i.e. 0M1'-0M4'.

In the preferred embodiments of FIGS. 4A-4B, the number of BEOL levels (10) in the 3D-array die 30 is substantially more than the number of the BEOL levels (4) in the peripheral-circuit die 40. A more stringent requirement is that the number of memory cells on a vertical memory string (8) in the 3D-array die 30 is at least twice as much as the number of interconnect levels in the peripheral-circuit die 40. Because the manufacturing cost of an integrated circuit is roughly proportional to the number of its BEOL levels, the peripheral-circuit die 40 has a much lower wafer cost than the 3D-array die 30. This cost reduction is sufficient to offset the extra bonding cost required by the discrete 3D-$M_V$. Accordingly, the discrete 3D-$M_V$ 50 has a lower overall cost than the integrated 3D-$M_V$ 20.

Furthermore, because the peripheral-circuit die 40 comprises more interconnect levels (4 vs. 2) than the in-die peripheral circuit 18 of the integrated 3D-$M_V$ die 20, the off-die peripheral-circuit components in the peripheral-circuit die 40 are easier to design, have a better performance and occupy less die area than its counterpart in the integrated 3D-$M_V$ die 20. Note that, although it comprises more interconnect levels (4 vs. 2) than the 3D-array die 30, the peripheral-circuit die 40 still comprises significantly fewer BEOL levels (4 vs. 10) than the 3D-array die 30.

In addition, because its BEOL process does not have to go through any high-temperature BEOL processing steps, the peripheral-circuit die 40 may use high-speed interconnect materials for its interconnects 0i' (e.g. copper and/or low-k dielectric). These high-speed interconnect materials can improve the performance of the peripheral-circuit die 40, as well as the overall 3D-$M_V$ performance.

For a conventional two-dimensional memory (2D-M, whose memory cells are arranged on a 2-D plane, e.g. flash memory), although it is technically possible to form at least a peripheral-circuit component in a peripheral-circuit die instead of a 2D-array die, doing so will raise the overall cost, degrade the overall performance and increase the overall size. This is because the 2D-array die and the peripheral-circuit die have similar BEOL structures, similar wafer costs and similar performance. Adding the extra bonding cost and delay, a discrete 2D-M has a higher cost, a slower speed and a larger size than an integrated 2D-M. This is in sharp contrast to the 3D-$M_V$. The 3D-array die 30 and peripheral-circuit die 40 of a discrete 3D-$M_V$ 50 have substantially different BEOL structures (e.g. different number of BEOL levels, different number of interconnect levels, different interconnect materials). As a result, a discrete 3D-$M_V$ has a lower overall cost, a better overall performance and a smaller overall size than an integrated 3D-$M_V$.

Different from the integrated 3D-$M_V$ 20, at least a peripheral-circuit component of the discrete 3D-$M_V$ 50 is located on the peripheral-circuit die 40 instead of the 3D-array die 30. In other words, the peripheral-circuit components of 3D-$M_V$ are partitioned between the 3D-array die 30 and the peripheral-circuit die 40. Several preferred partitioning schemes are disclosed in FIGS. 5A-9B.

FIGS. 5A-5B disclose a first preferred partitioning scheme. The discrete 3D-$M_V$ 50 comprises a 3D-array die 30 and a peripheral-circuit die 40. In FIG. 5A, the 3D-array die 30 comprises a plurality of 3D-$M_V$ arrays (e.g. 22aa, 22ay) and decoders. It also comprises an in-die $V_R/V_W$-generator 41. In FIG. 5B, the peripheral-circuit die 40 comprises at least an off-die A/D-translator 49, which is absent from the 3D-array die 30 of FIG. 5A. Without the A/D-translator 49, the 3D-array die 30 of FIG. 5A is not a functional memory per se but has a higher array efficiency. Alternatively, the 3D-array die 30 comprises an in-die A/D-translator, while the peripheral-circuit die 40 comprises an off-die $V_R/V_W$-generator, which is absent from the 3D-array die 30. Similarly, without the $V_R/V_W$-generator, the 3D-array die 30 of FIG. 5A is not a functional memory per se but has a higher array efficiency.

FIGS. 6A-6B disclose a second preferred partitioning scheme. The discrete 3D-$M_V$ 50 comprises a 3D-array die 30 and a peripheral-circuit die 40. In FIG. 6A, the 3D-array die 30 comprises the 3D-$M_V$ arrays (e.g. 22aa, 22ay) and their decoders, but does not comprise the $V_R/V_W$-generator 41 and the A/D-translator 49. In FIG. 6B, the peripheral-circuit die 40 comprises not only the A/D-translator 49, but also the $V_R/V_W$-generator 41. The 3D-array die 30 of FIG. 6A has a very high array efficiency. This leads to a substantially lower overall cost for the discrete 3D-$M_V$.

Figure 7A:
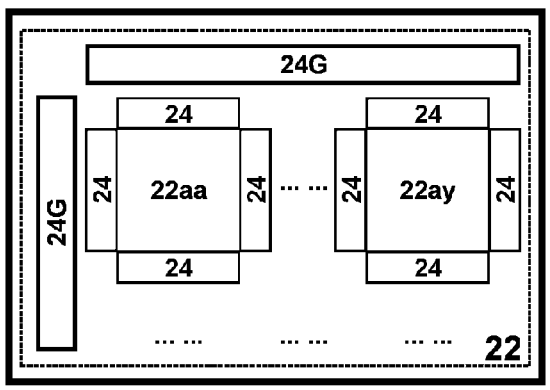
FIGS. 7A-7C disclose a third preferred partitioning scheme.
Figure 7B:
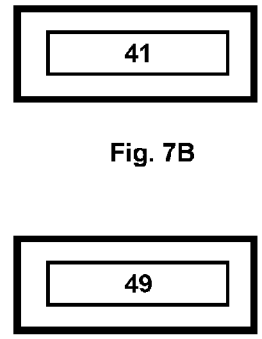
Figure 7C:
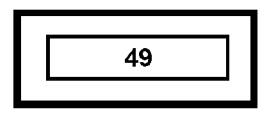

FIGS. 7A-7C disclose a third preferred partitioning scheme. The discrete 3D-$M_V$ 50 comprises a 3D-array die 30, two peripheral-circuit dice 40, 40*. The 3D-array die 30 comprises 3D-$M_V$ arrays (e.g. 22aa, 22ay) and their decoders, but does not comprise the $V_R/V_W$-generator 41 and the A/D-translator 49 (FIG. 7A). The $V_R/V_W$-generator 41 and the A/D-translator 49 are located on separate dice: the $V_R/V_W$-generator 41 is located on the peripheral-circuit die A 40 (FIG. 7B); the A/D-translator 49 is located on the peripheral-circuit die B 40* (FIG. 7C). As is well known to those skilled in the art, the $V_R/V_W$-generator is an analog-intensive circuit, whereas the A/D-translator is a digital-intensive circuit. Because they are located on separate dice, these circuits can be optimized independently: the peripheral-circuit die A 40 is optimized for analog performance, whereas the peripheral-circuit die B 40* is optimized for digital performance.

Figure 8A:
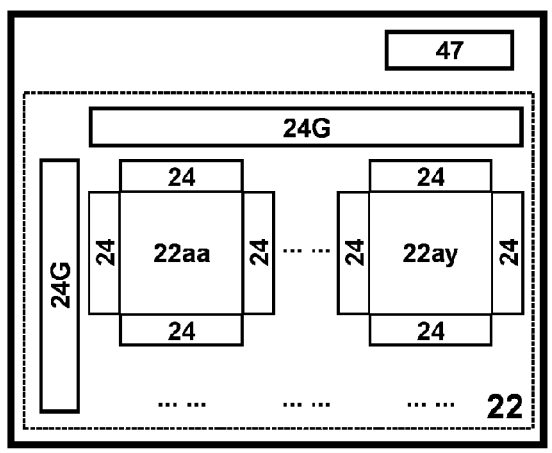
FIGS. 8A-8B disclose a fourth preferred partitioning scheme.
Figure 8B:
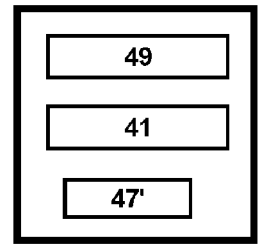

FIGS. 8A-8B disclose a fourth partitioning scheme. It is similar to those in FIGS. 6A-6B except that the 3D-array die 30 further comprises a first serializer-deserializer (SerDes) 47 (FIG. 8A). It converts parallel digital signals (e.g. address/data/command/status) inside the 3D-array die 30 to serial digital signals outside the 3D-array die 30 and vice versa. In the mean time, the peripheral-circuit die 40 comprise a second serializer-deserializer (SerDes) 47' (FIG. 8B). It converts parallel digital signals (e.g. address/data/command/status) inside the peripheral-circuit die 40 to serial digital signals outside the peripheral-circuit die 40 and vice versa. By serializing digital signals, the number of bond wires (or, solder bumps) can be reduced between the 3D-array die 30 and the peripheral-circuit die 40. This helps to lower the bonding cost.

Figure 9A:
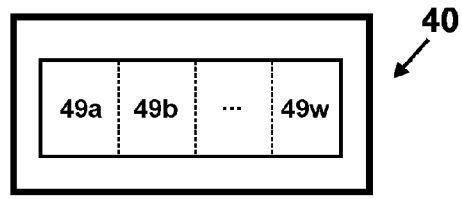
FIGS. 9A-9B are block diagrams of two preferred peripheral-circuit dice supporting multiple 3D-array dice.
Figure 9B:
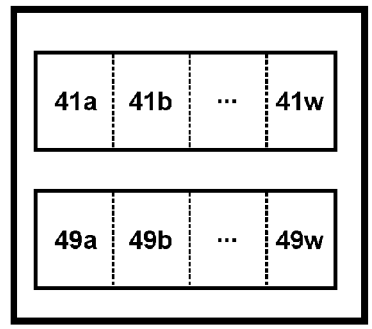

Referring now to FIGS. 9A-9B, two preferred peripheral-circuit dice 40 supporting multiple 3D-array dice are illustrated. The peripheral-circuit die 40 of FIG. 9A comprises a plurality of A/D-translators 49a, 49b . . . 49w (or, $V_R/V_W$-generators). Each A/D-translator (e.g. 49a) translates address/data for an associated 3D-array die (e.g. 30a of FIG. 3D). The preferred peripheral-circuit die 40 of FIG. 9B further comprises a plurality of $V_R/V_W$-generators 41a, 41b . . . 41w. Each $V_R/V_W$-generator (e.g. 41a) provides read/write-voltages to an associated 3D-array die (e.g. 30a of FIG. 3D).

Figure 10A:
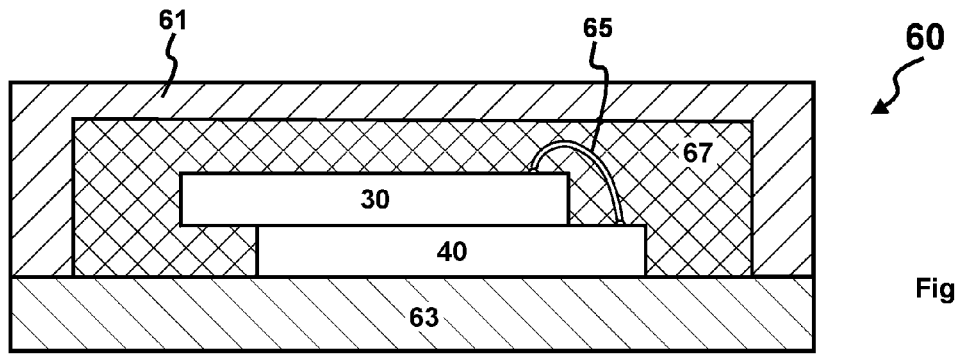
FIGS. 10A-10B are cross-sectional views of two preferred discrete 3D-$M_V$ packages.
Figure 10B:
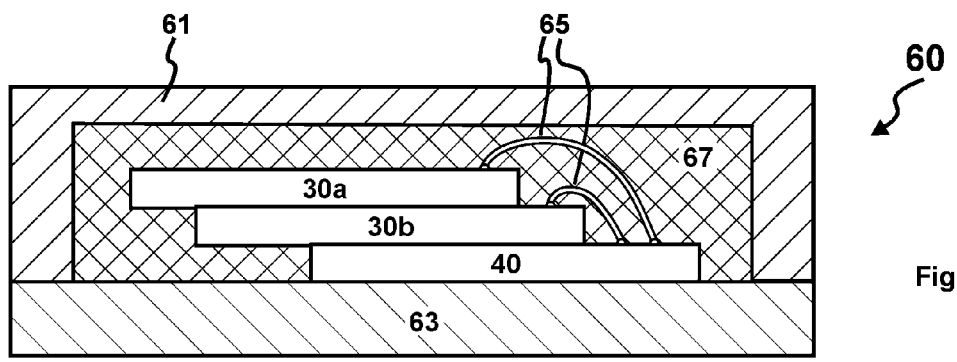
Figure 10C:
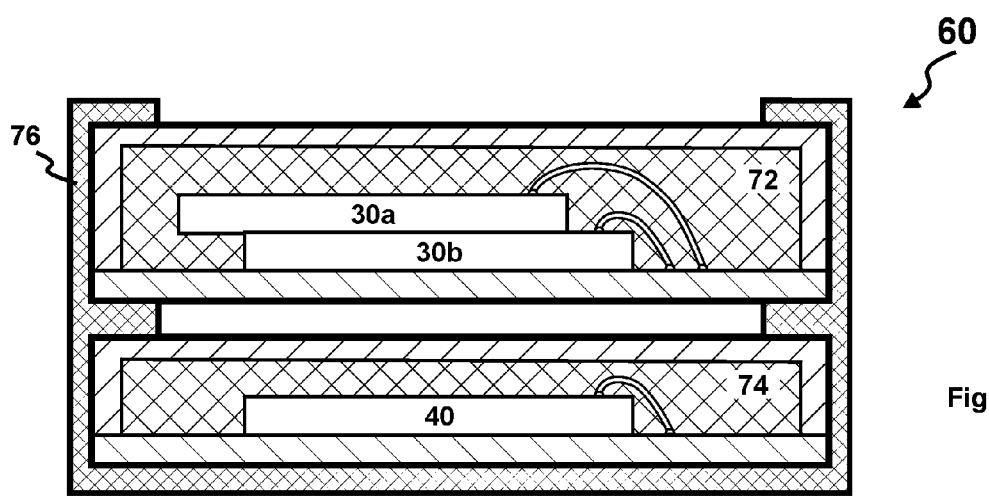
FIG. 10C is a cross-sectional view of a preferred discrete 3D-$M_V$ module.

Referring now to FIG. 10A-10C, several preferred discrete 3D-$M_V$ packages (or, module) 60 are disclosed. The 3D-$M_V$ packages in FIGS. 10A-10B are multi-chip package (MCP), while the 3D-$M_V$ module in FIG. 10C is a multi-chip module (MCM). These MCP's and MCM's can be used as a memory card and/or a solid-state drive.

The preferred discrete 3D-$M_V$ package 60 of FIG. 10A comprises two separate dice: a 3D-array die 30 and a peripheral-circuit die 40. These dice 30, 40 are vertically stacked on a package substrate 63 and located inside a package housing 61. Bond wires 65 provide electrical connection between the dice 30 and 40. Here, bond wire 65 provides a coupling means between the 3D-array die 30 and the peripheral-circuit die 40. Other exemplary coupling means include solder bump. To ensure data security, the dice 30, 40 are preferably encapsulated into a molding compound 67. In this preferred embodiment, the 3D-array die 30 is vertically stacked above the peripheral-circuit die 40. Alternatively, the peripheral-circuit die 40 can be vertically stacked above the 3D-array die 30; or, the 3D-array die 30 can be stacked face-to-face towards the peripheral-circuit die 40; or, the 3D-array die 30 can be mounted side-by-side with the peripheral-circuit die 40.

The preferred discrete 3D-$M_V$ package 60 of FIG. 10B comprises two 3D-array dice 30a, 30b and a peripheral-circuit die 40. These dice 30a, 30b, 40 are three separate dice. They are located inside a package housing 61. The 3D-array die 30a is vertically stacked on the 3D-array die 30b, and the 3D-array die 30b is vertically stacked on the peripheral-circuit die 40. Bond wires 65 provide electrical connections between the dice 30A, 30B, and 40.

The preferred discrete 3D-$M_V$ module 60 of FIG. 10C comprises a module frame 76, which houses two discrete packages, i.e. a 3D-array package 72 and a peripheral-circuit package 74. The 3D-array package 72 comprises two 3D-array dice 30a, 30b, while the peripheral-circuit package 74 comprises a peripheral-circuit die 40. The module frame 76 provides electrical connections between the 3D-array package 72 and the peripheral-circuit package 74 (not drawn in this figure).

Figure 11A:
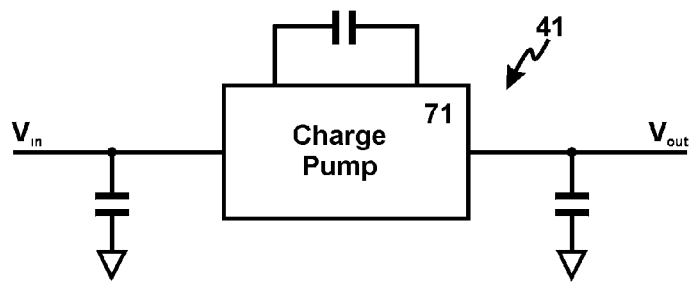
FIGS. 11A-11C are block diagrams of three preferred read/write-voltage generators.
Figure 11B:
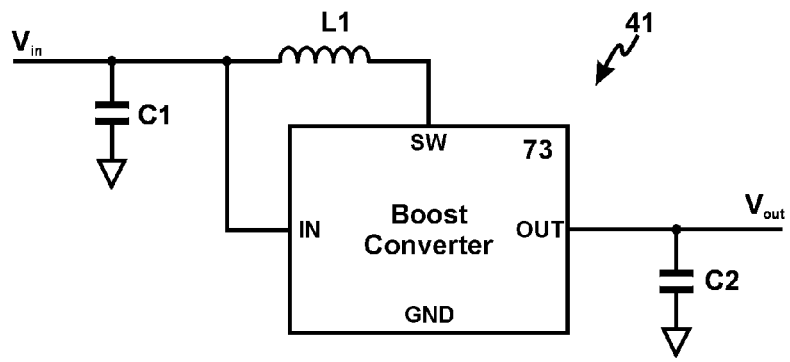
Figure 11C:
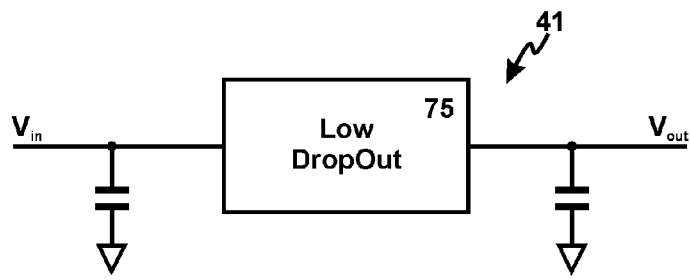

Referring now to FIGS. 11A-11C, three preferred voltage generators 41 are disclosed. The voltage generator 41 preferably uses a DC-to-DC converter. It could be a step-up, whose output voltage is higher than the input voltage, or a step-down, whose output voltage is lower than the input voltage. Examples of step-up include charge pump (FIG. 11A) and boost converter (FIG. 11B), and examples of step-down include low dropout (FIG. 11C) and buck converter.

In FIG. 11A, the voltage generator 41 includes a charge pump 71 to provide an output voltage $V_{out}$ that is higher than the input voltage $V_{in}$. The voltage generator 41 may include one or more integrated circuits and also include one or more discrete devices. Charge pump 71 may generally be formed having a low profile that fits within the physical constraints of low-profile memory cards.

In FIG. 11B, the voltage generator 41 is a high frequency boost converter 73. It may also be used to generate an output voltage $V_{out}$ that is higher than an input voltage $V_{in}$. A boost converter may be formed with a low profile inductor so that the profile of the $V_R/V_W$-generator is within the limits for a memory card or a solid-state drive.

In FIG. 11C, the voltage generator 41 includes a low dropout (LDO) 75 to provide an output voltage $V_{out}$ that is lower than the input voltage $V_{in}$. Generally, an LDO uses one or more (in this case, two) capacitors. Thus, the $V_R/V_W$-generator may be comprised of at least one die and may also include one or more discrete devices.

Figure 12A:
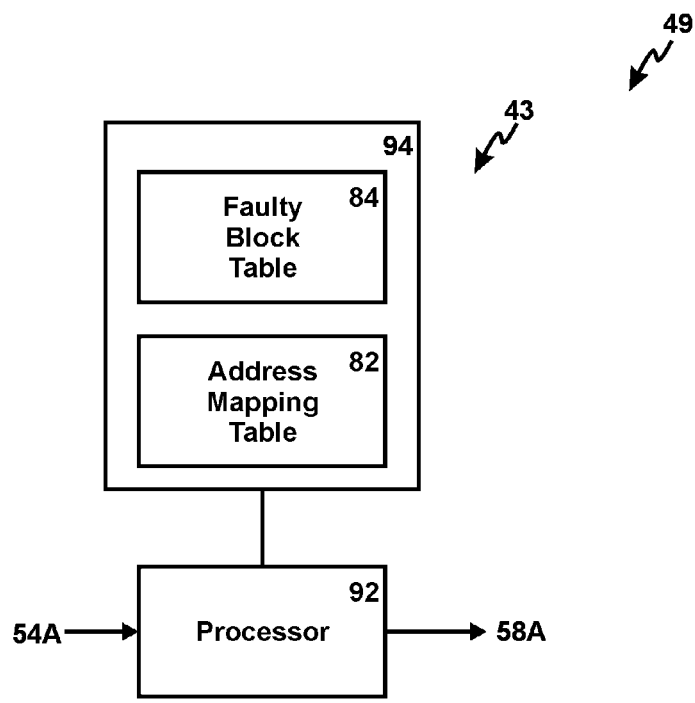
FIG. 12A is a block diagram of a preferred address translator.
Figure 12B:
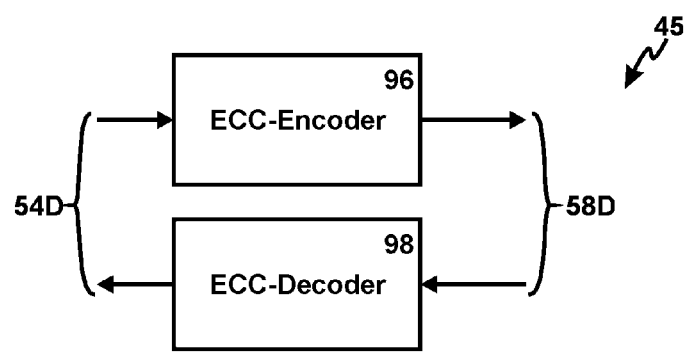
FIG. 12B is a block diagram of a preferred data translator.

Referring now to FIGS. 12A-12B, components of an A/D-translator 49, i.e. address translator 43 and data translator 45, are disclosed. FIG. 12A discloses a preferred address translator 43. It converts the logical address 54A it receives from the host to the physical address 58A of a 3D-array die. The address translator 43 comprises a processor 92 and a memory 94. The memory 94 preferably stores an address mapping table 82, a faulty block table 84 and others. These tables are permanently stored in a read-only memory (ROM), which could a non-volatile memory (NVM) such as flash memory. During operation, these tables are loaded into a random-access memory (RAM) for faster access. When a single A/D-translator die 40* supports multiple 3D-array dice (e.g. 30a, 30b . . . 30w, as shown in FIG. 2C), the memory 94 stores tables for all 3D-array dice supported by the A/D-translator die 40*. In other words, the memory 94 is shared by all 3D-array dice 30a, 30b . . . 30w.

FIG. 12B discloses a preferred data translator 45. It converts the logical data it receives from the host to the physical data of a 3D-array die, or converts the physical data of a 3D-array die to the logical data it outputs to the host. The data translator 45 comprises an ECC-encoder 96 and an ECC-decoder 98. The ECC-encoder 96 encodes the input logical data 54D to the physical data 58D, which are to be stored in the 3D-$M_V$ array. The ECC-decoder 98 decodes the physical data 58D retrieved from the 3D-$M_V$ array to the output logical data 54D. During this process, the error bits in the physical data 58D are detected and corrected. The ECC coding algorithms that are suitable for the 3D-$M_V$ include Reed-Solomon coding, Golay coding, BCH coding, Multi-dimensional parity coding, Hamming coding and others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional vertical memory (3D-$M_V$), comprising:
    a 3D-array die comprising at least a 3D-$M_V$ array, wherein said 3D-$M_V$ array comprises a plurality of vertical memory strings, each of said vertical memory strings comprising a plurality of vertically stacked memory cells;
    a peripheral-circuit die comprising at least an off-die peripheral-circuit component of said 3D-$M_V$ array, wherein said off-die peripheral-circuit component is absent from said 3D-array die;
    wherein the number of interconnect levels in said peripheral-circuit die is more than the number of interconnect levels in said 3D-array die, but substantially less than the number of memory cells on each of said vertical memory strings in said 3D-array die; and, said 3D-array die and said peripheral-circuit die are separate dice.

2. The memory according to claim 1, wherein said 3D-$M_V$ is a vertical-NAND.

3. The memory according to claim 1, wherein said 3D-$M_V$ is a three-dimensional read-only memory (3D-ROM).

4. The memory according to claim 1, wherein said 3D-$M_V$ is a three-dimensional random-access memory (3D-RAM).

5. The memory according to claim 1, wherein said 3D-$M_V$ is a 3D-memristor.

6. The memory according to claim 1, wherein said 3D-$M_V$ is a 3D-RRAM or 3D-ReRAM (resistive random-access memory).

7. The memory according to claim 1, wherein said 3D-$M_V$ is a 3D-PCM (phase-change memory).

8. The memory according to claim 1, wherein said 3D-$M_V$ is a 3D-PMC (programmable metallization-cell memory).

9. The memory according to claim 1, wherein said 3D-$M_V$ is a 3D-CBRAM (conductive-bridging random-access memory).

10. The memory according to claim 1, wherein said 3D-array die and said peripheral-circuit die are located in a memory package.

11. The memory according to claim 1, wherein said 3D-array die and said peripheral-circuit die are located in a memory module.

12. The memory according to claim 1, wherein said 3D-array die and said peripheral-circuit die are located in a memory card.

13. The memory according to claim 1, wherein said 3D-array die and said peripheral-circuit die are located in a solid-state drive.

14. The memory according to claim 1, further comprising another 3D-array die including at least another 3D-$M_V$ array, wherein said peripheral-circuit die comprises at least another portion of another off-die peripheral-circuit component for said another 3D-array die.

15. The memory according to claim 1, wherein said off-die peripheral-circuit component is a read-voltage generator.

16. The memory according to claim 1, wherein said off-die peripheral-circuit component is a write-voltage generator.

17. The memory according to claim 1, wherein said off-die peripheral-circuit component is an address translator.

18. The memory according to claim 1, wherein said off-die peripheral-circuit component is a data translator.

* * * * *